(12) United States Patent
Abdellaoui et al.

(10) Patent No.: US 7,346,124 B2
(45) Date of Patent: Mar. 18, 2008

(54) WIDEBAND QUADRATURE GENERATION TECHNIQUE REQUIRING ONLY NARROWBAND COMPONENTS AND METHOD THEREOF

(75) Inventors: Mohsen Abdellaoui, San Diego, CA (US); Yong-Suk Kim, Daejeon (KR); Wan-jin Kim, Seoul (KR); Dan Meacham, San Diego, CA (US); Woo-Kyung Lee, Suwon-si (KR)

(73) Assignees: Samsung Electronics Co., Ltd., Suwon-si (KR); Staccato Communications, Inc., San Diego, CA (US)

( * ) Notice: Subject to any disclaimer, the term of this patent is extended or adjusted under 35 U.S.C. 154(b) by 652 days.

(21) Appl. No.: 10/889,178

(22) Filed: Jul. 13, 2004

(65) Prior Publication Data
US 2005/0013344 A1 Jan. 20, 2005

Related U.S. Application Data

(60) Provisional application No. 60/486,436, filed on Jul. 14, 2003.

(30) Foreign Application Priority Data
Mar. 29, 2004 (KR) ............ 10-2004-0021288

(51) Int. Cl.
*H03C 1/52* (2006.01)
(52) U.S. Cl. ..................... 375/300
(58) Field of Classification Search ........ 375/130, 375/135, 146, 295, 300, 301, 308, 270, 277, 375/321; 455/47, 109, 46; 332/167, 170
See application file for complete search history.

(56) References Cited

U.S. PATENT DOCUMENTS 6,343,211 B1 * 1/2002 Thodesen et al. ........... 455/317
6,496,545 B1 * 12/2002 Liu .......................... 375/301

OTHER PUBLICATIONS

Pappenfus:. "single sideband principles and circuit", May 19, 1964, McGraw Hill, New York 20609, XP002358761.
Cavers J K et al. "Adaptive Compensation for Imbalance and Offset Losses in Direct Conversion Transceivers", IEEE Transactions on Vehicular Technology, IEEE Inc. New York, US, vol. 42, No. 4, Nov. 1, 1993, pp. 581-588, XP000421234.

* cited by examiner

*Primary Examiner*—Sam K. Ahn
(74) *Attorney, Agent, or Firm*—Sughrue Mion, PLLC

(57) ABSTRACT

A method for reference signal generating in an ultra wideband (UWB) communication system which sends out and receives data by using at least two reference signals of predetermined frequencies. A first signal group, which comprises a local oscillation (LO) signal and a signal at a predetermined phase difference with respect to the LO signal, is generated. One among at least two intermediate frequency (IF) signals is selected for the adjustment of the frequency of the LO signals, and a second signal group, which comprises the selected IF signal and a signal at a predetermined phase difference with respect to the selected IF signal, is generated. Two mixed signals are generated from the first and the second signal groups, the mixed signals being mixed without overlap, and a reference signal is generated by adding the two generated signals.

20 Claims, 5 Drawing Sheets

WIDEBAND QUADRATURE GENERATION TECHNIQUE REQUIRING ONLY NARROWBAND COMPONENTS AND METHOD THEREOF

CROSS-REFERENCE TO RELATED APPLICATIONS

This application claims the benefit of Korean Patent Application No. 2004-21288 filed on Mar. 29, 2004 in the Korean Intellectual Property Office, and U.S. Provisional Patent Application No. 60/486,436, filed on Jul. 14, 2003, in the U.S. Patent and Trademark Office, the disclosures of which are incorporated herein in their entireties by reference.

BACKGROUND OF THE INVENTION

1. Field of the Invention

An apparatus consistent with the present invention relates to a frequency band of a communication system and, more particularly, to a method of transmitting and receiving data using a multi-band.

2. Description of the Related Art

A communication system generally uses frequency of a predetermined band for data transmission. The data used in such communication are mainly classified as circuit data or packet data. The circuit data requires real-time transmission and reception such as audio signals. The packet data have a certain amount of data, such as packet information, and do not necessarily require real-time data transmission. The frequency band for the circuit data is usually narrow, while the frequency band for the packet data is relatively wide.

When the amount of data for transmission increases, the frequency band also increases. Hereinbelow, the relatively wider frequency band is called 'Ultra Wide Band (UWB)'. The UWB is divided into a plurality of sub-frequency bands. The communication system transmits data using the plurality of sub-frequency bands at a predetermined time, and is capable of transmitting a considerable amount of data during the predetermined time period. The communication system selects one among the plurality of sub-frequency bands during the predetermined time period, and transmits data using the selected sub-frequency band. Therefore, data security can be provided. In other words, because the plurality of sub-frequency bands are sequentially used, data security can be guaranteed.

FIG. 1 shows the structure of a currently-suggested UWB. As shown, the currently-suggested UWB uses frequency bands from 3432 MHz to 10032 MHz. The frequency bands of the UWB are mainly grouped into 4 groups, i.e., Groups A, B, C and D. Group A consists of 3 sub-frequency bands, and Group B consists of 2 sub-frequency bands. Group C consists of 4 sub-frequency bands, and Group D consists of 4 sub-frequency bands.

More specifically, there are frequencies of 3432 MHz, 3960 MHz and 4488 GHz at 3 sub-frequency bands of Group A, and there are 5016 MHz and 5808 MHz at the 2 sub-frequency bands of Group B. Group C consists of 4 frequencies of 6336 MHz, 6864 MHz, 7392 MHz and 7920 MHz, and Group D consists of 4 frequencies of 8448 MHz, 8976 MHz, 9504 MHz and 10032 MHz. The sub-frequency bands of Group B overlap with the frequency bands currently used in wireless LAN, and it is almost impossible to use the sub-frequency bands of Group D with currently-available technology. Accordingly, the use of sub-frequency bands of Groups A and C is mainly discussed.

In order to use the 3 sub-frequency bands of Group A and the 4 sub-frequency bands of Group C, 7 reference signals need be generated. In other words, a structure is required to generate 7 reference signals for the use of 3 the sub-frequency bands of Group A and the 4 sub-frequency bands of Group C.

The communication system transmits data using reference signals, and generally, the 7 reference signals are generated by a local oscillator. The local oscillator will now be explained briefly below.

FIG. 2 shows an oscillator to generate 7 reference signals. As shown, there are 7 local oscillators for the generation of the 7 reference signals. In other words, one local oscillator is' required to generate one reference signal. A phase locked loop (PLL) operates to stabilize the frequency of the reference signals, which are generated by the local oscillators. Accordingly, each local oscillator has a corresponding PLL. The process of generating the 7 reference signals will be described below with reference to FIG. 2.

A first local oscillator 200 generates a reference signal at a frequency of 3432 MHz, and a second local oscillator 202 generates a reference signal at a frequency of 3960 MHz. A third local oscillator 204 generates a reference signal at a frequency of 7920 MHz. A first PLL 210 stabilizes the frequency of the reference signal generated at the first local generator 200 and transmits it to a selector 220. A second PLL 212 stabilizes the frequency of the reference signal generated at the second local oscillator 202 and transmits it to the selector 220. A third PLL 214 stabilizes the reference signal generated at the third local generator 204 and transmits it to the selector 220. In accordance with a control signal, the selector 220 selects one among the stabilized reference signals and outputs the selected reference signal. The reference signal outputted from the selector 220 is combined with data and transmitted to the receiver.

As shown in FIG. 2, in order to generate 7 reference signals, 7 local oscillators together with 7 corresponding PLLs are required. The problem is that the local oscillators and the PLLs consume a good deal of energy. Additionally, the local generators and PLLs increase the overall volume of the system. Therefore, an improved method to resolve these problems is required.

SUMMARY OF THE INVENTION

The present invention has been developed in order to solve the above drawbacks and other problems associated with the conventional arrangement. An aspect of the present invention is to provide an apparatus and a method thereof, which is capable of generating a signal for a wideband communication system using an apparatus that uses narrow-band components.

It is another aspect of the present invention to provide an apparatus and a method thereof that is capable of generating frequencies to be used in a wideband communication system using the least number of signals as possible.

It is yet another aspect of the present invention to provide an apparatus and a method thereof that is capable of generating at least 2 frequencies for use in a wideband communication system and increasing the data transmission efficiency through frequency hopping.

The above objects of the present invention can substantially be achieved by providing a method for generating a reference signal in an ultra wideband (UWB) communication system that sends out and receives data by using at least two reference signals of a predetermined frequency. The reference signal generating method comprises: generating a first signal group which comprises a local oscillation (LO) signal and a signal at a predetermined phase difference with respect to the LO signal; selecting one among at least two intermediate frequency (IF) signals for the adjustment of the frequency of the LO signals; generating a second signal group which comprises the selected IF signal and a signal at a predetermined phase difference with respect to the selected IF signal; generating two mixed signals from the first and the second signal groups, the mixed signals being mixed without overlap; and generating a reference signal by adding the two generated signals.

The above object can substantially be achieved by providing an apparatus for generating a reference signal in an ultra wideband (UWB) communication system which sends out and receives data by using at least two reference signals at a predetermined frequency, the apparatus comprising: a phase-shifter for generating a first signal group which comprises a local oscillation (LO) signal and a signal at a predetermined phase difference with respect to the LO signal; a multiplexer for selecting a signal from a second signal group which comprises at least two intermediate frequency (IF) signals and signals at a predetermined phase difference with respect to the respective IF signals, the selected signal being at a predetermined phase difference with respect to the IF signals; and a single sideband (SSB) generator for generating a reference signal by adding two mixed signals from the phase-shifter and the multiplexer, the mixed signals being mixed without overlap.

BRIEF DESCRIPTION OF THE DRAWINGS

The above and other features of the present invention will be readily apparent by describing, in detail, exemplary embodiments thereof with reference to the accompanying drawings, in which.

DETAILED DESCRIPTION OF ILLUSTRATIVE, NON-LIMITING EMBODIMENTS OF THE INVENTION

Figure 1:
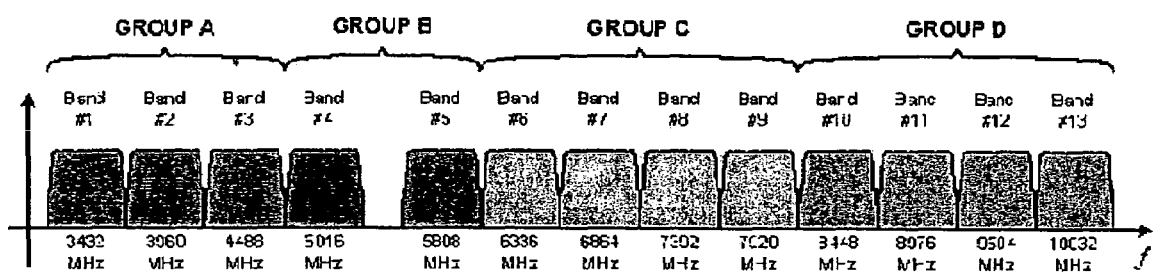
FIG. 1 is a view illustrating the structure of an ultra wide band (UWB)
Figure 2:
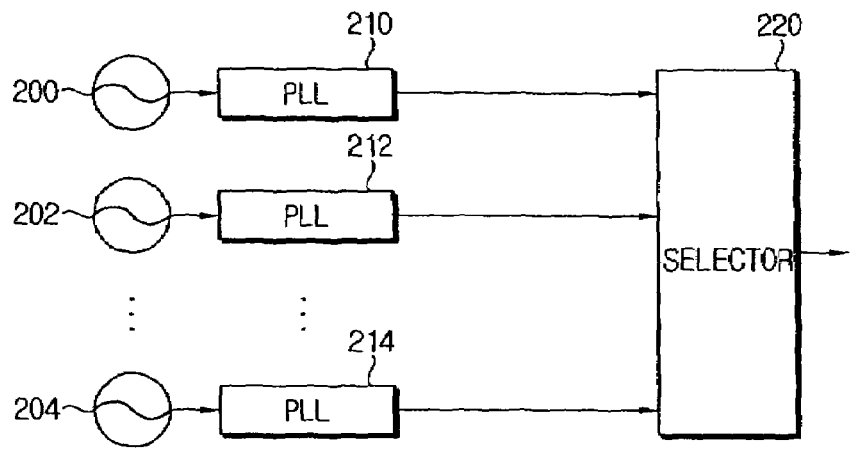
FIG. 2 is a view illustrating the process of generating a plurality of reference frequencies for use in the UWB.

An apparatus consistent with the present invention will now be described more fully with reference to the accompanying drawings, in which illustrative, non-limiting embodiments of the invention are shown. In the drawings, like reference numerals refer to like elements throughout.

In the following description, the matters defined in the description, such as the detailed construction and the elements, are exemplary and are provided to assist the reader in a comprehensive understanding of the invention. Thus, it is apparent that the present invention can be carried out even without those defined matters. Also, well-known functions or constructions are not described in detail since they would obscure the invention with unnecessary detail.

Figure 3:
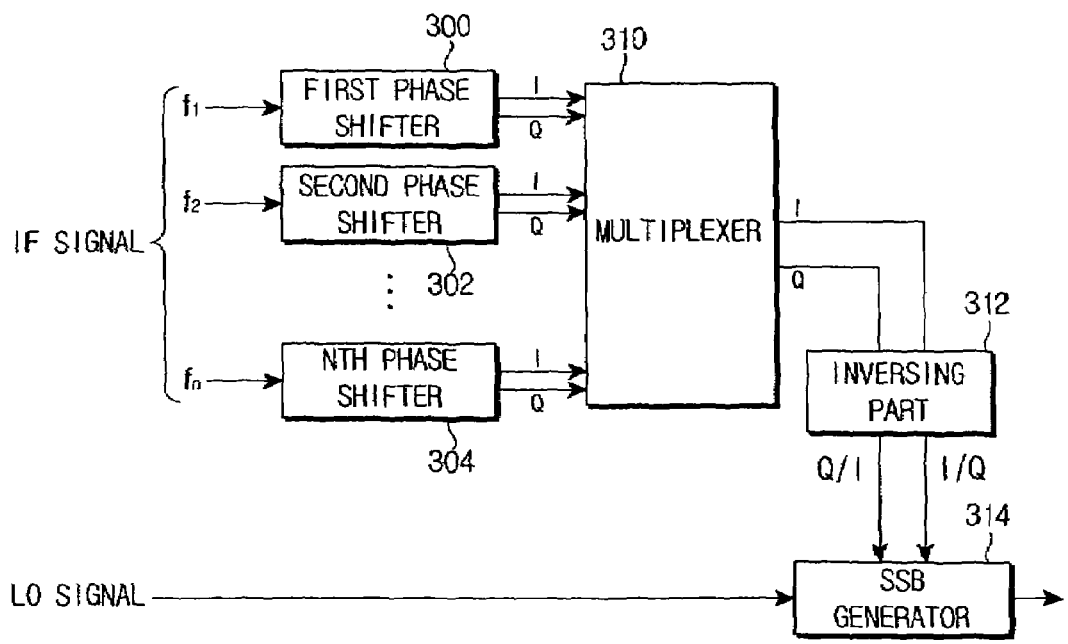
FIG. 3 is a view illustrating the process of generating a plurality of reference signals for use in UWB according to an embodiment of the present invention.

FIG. 3 shows the structure for generating reference frequencies according to an embodiment of the present invention. The system, as shown in FIG. 3, comprises phase shifters 300, 302 and 304 and a multiplexer 310, an inverse part 312, and a SSB generator 314.

The signals are shifted vertically as much as an intermediate frequency, generating an upper sideband (USB) and a lower sideband (LSB) of same information volume. Transmitting both the USB and LSB is called a double sideband (DSB), and to remove one unnecessary sideband and transmit one remaining sideband is called a single sideband (SSB). For example, because signals such as voice and music contain almost no signal component in the low frequency band, communication is possible only with SSB.

The phase shifters 300, 302, 304 output the received signals, including both the signals with and without phase shift. The signal from the phase shifter hereinbelow is called the "group signal." The phase shifters 300, 302, 304 transmit the generated signals to the multiplexer 310. The multiplexer 310 transmits the necessary signal among the received signals to the inversing part 312. Operation and effect by the inversing part 312 will be described in detail later.

The inversing part 312 determines whether or not to inverse the received signals. If the determination is to inverse, the inversing part 312 inverses the signals and transmits them to the SSB generator 314, and if the determination is not to inverse, the inversing part 312 directly transmits the signals to the SSB generator 314, i.e., without the inversing. The signals transmitted by the multiplexer 310 include a signal with a phase shift and a signal without a phase shift. A switch may be used as an alternative to the multiplexer 310, shown in FIG. 3, as an apparatus for selecting a signal for transmitting to the SSB generator 314. The SSB generator 314 performs a phase shift with respect to a LO signal only, and it does not perform a phase shift with respect to the signal from the inversing part 312. As a result, efficiency of the SSB generator is improved.

Figure 4:
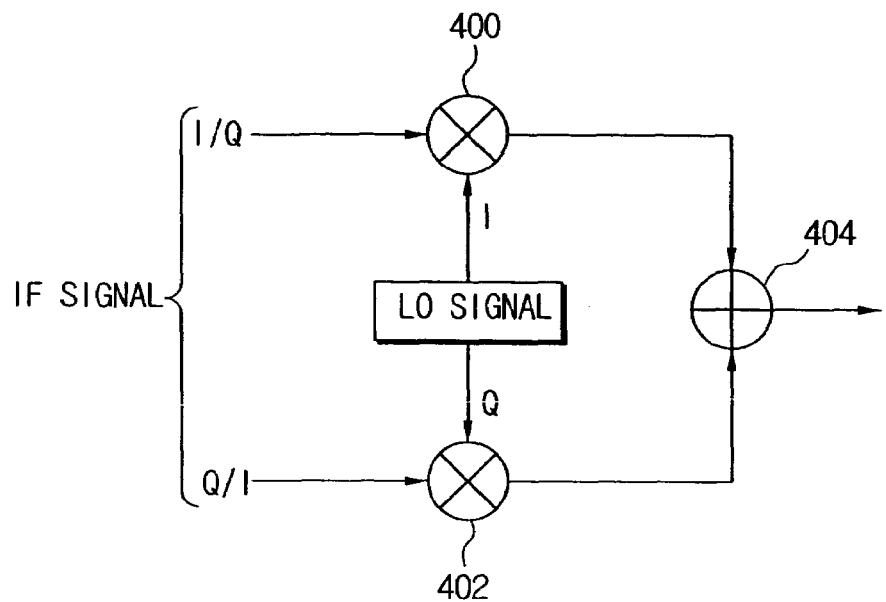
FIG. 4 is a view illustrating the process of generating single side band (SSB)

FIG. 4 shows the structure of a SSB generator according to an embodiment of the present invention. The structure of the SSB generator will now be described with reference to FIG. 4. The SSB generator comprises two mixers and one computation part.

Each of the mixers 400 and 402 performs mixing with respect to inputted IF and LO signals. After the mixing, signals are transmitted to an adder 404. The adder 404 performs increment or decrement summation with the received signals. The process in which one signal is outputted from the SSB generator will be described below.

First, an I-component of the IF signal is inputted to the first mixer 400, and a Q-component of the IF signal is inputted to the second mixer 402. The I-component to the first mixer 400 is $\cos(w_{IF}t)$, and the Q-component to the second mixer 402 is $\sin(w_{IF}t)$. Also, an I-component of LO signal is inputted to the first mixer 400, and a Q-component of LO signal is inputted to the second mixer 402. The operations at the mixers 400 and 402 can be expressed by the following equations:

$$\cos(w_{LO}t)\cos(w_{IF}t) = \frac{1}{2}[\cos((w_{LO}+w_{IF})t) + \cos((w_{LO}-w_{IF})t)] \quad \text{[Equation 1]}$$

-continued $$\sin(w_{LO}t)\sin(w_{IF}t) = \frac{1}{2}[-\cos((w_{LO}+w_{IF})t)+\cos((w_{LO}-w_{IF})t)] \quad \text{[Equation 2]}$$

The operation of the first mixer 400 can be expressed by equation 1, and the operation of the second mixer 402 can be expressed by equation 2. After the mixing at the respective mixers 400 and 402, the signals are transmitted to the adder 404. The adder 404 adds the signals from the mixers 400 and 402. More specifically, the operation of adder 404 can be expressed by the following equation:

$$\frac{1}{2}[\cos((w_{LO}+w_{IF})t)+\cos((w_{LO}-w_{IF})t]+ \quad \text{[Equation 3]}$$
$$\frac{1}{2}[-\cos((w_{LO}+w_{IF})t)+\cos((w_{LO}-w_{IF})t)] =$$
$$\cos((w_{LO}-w_{IF})t)$$

As shown in equation 3, the adder 404 outputs the signal, which is the result of subtracting the IF signal frequency from the LO signal frequency. That is, the adder 404 outputs a LSB signal. The process in which an I-component of the IF signal is inputted to the second mixer 402 is now described. In this case, a Q-component of the IF signal to the first mixer 400 is $\sin(w_{IF}t)$, and an I-component of the IF signal to the second mixer 402 is $\cos(w_{IF}t)$. An I-component of the LO signal is inputted to the first mixer 400, and a Q-component of the LO signal is inputted to the second mixer 402. The operations at the respective mixers 400 and 402 can be expressed by the following equations:

$$\sin(w_{LO}t)\cos(w_{IF}t) = \frac{1}{2}[\sin((w_{LO}+w_{IF})t)+\sin((w_{LO}-w_{IF})t)] \quad \text{[Equation 4]}$$

$$\cos(w_{LO}t)\sin(w_{IF}t) = \frac{1}{2}[\sin((w_{LO}+w_{IF})t)-\sin((w_{LO}-w_{IF})t)] \quad \text{[Equation 5]}$$

The operation of the first mixer 400 can be expressed by equation 4, and the operation of the second mixer 402 can be expressed by equation 5. After the mixing, the signals are transmitted from the mixers 400 and 402 to the adder 404. The adder 404 adds the signals from the mixers 400 and 402. The operation at the adder 404 can be expressed by the following equation:

$$\frac{1}{2}[\sin((w_{LO}+w_{IF})t)+\sin((w_{LO}-w_{IF})t)]+ \quad \text{[Equation 6]}$$
$$\frac{1}{2}[\sin((w_{LO}+w_{IF})t)-\sin((w_{LO}-w_{IF})t)] =$$
$$\sin((w_{LO}+w_{IF})t)$$

As shown in the equation 6, the adder 404 outputs a signal of the frequency which is the result of adding the IF signal frequency to the LO signal frequency. That is, the adder 404 outputs an USB signals. By performing the operations expressed in equations 3 and 6, two reference frequencies can be generated using one LO signal and one IF signal.

Figure 5:
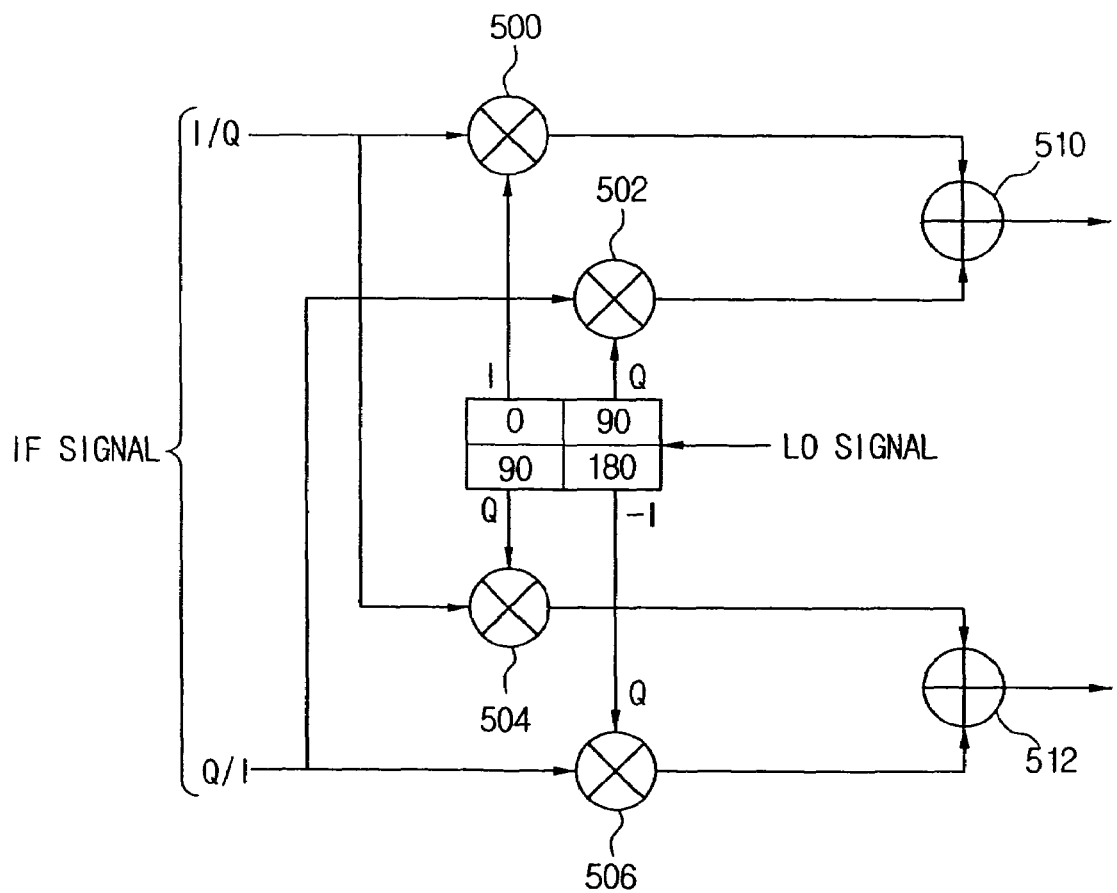
FIG. 5 is a view illustrating the structure of a SSB generator using a QPSK modulation according to an embodiment of the present invention.

FIG. 5 shows a SSB generator using QPSK modulation. The QPSK is used to increase the amount of data for transmission.

First, a description as to when an I-component of the IF signal is inputted to the first and third mixers 500 and 504, and a Q-component of the IF signal is inputted to the second and fourth mixers 502 and 506 is given. The I-component of the IF signal to the first and third mixers 500 and 504 is $\cos(w_{IF}t)$, and the Q-component of the IF signal to the second and fourth mixers 502 and 506 is $\sin(w_{IF}t)$. Also, an I-component of the Lo signal is inputted to the first mixer 500, and a Q-component of the LO signal is inputted to the second and third mixers 502 and 504. An (−I) component of the LO signal is also inputted to the fourth mixer 506. The operations at mixers 500, 502, 504 and 506 can be expressed by the following equations.

$$\cos(w_{LO}t)\cos(w_{IF}t) = \frac{1}{2}[\cos((w_{LO}+w_{IF})t+\cos((w_{LO}-w_{IF})t)] \quad \text{[Equation 7]}$$

$$\sin(w_{LO}t)\sin(w_{IF}t) = \frac{1}{2}[-\cos((w_{LO}+w_{IF})t)+\cos(w_{LO}-w_{IF})t)] \quad \text{[Equation 8]}$$

$$\sin(w_{LO}t)\cos(w_{IF}t) = \frac{1}{2}[\sin((w_{LO}+w_{IF})t)+\sin((w_{LO}-w_{IF})t)] \quad \text{[Equation 9]}$$

$$-\cos(w_{LO}t)\sin(w_{IF}t) = \frac{1}{2}[-\sin((w_{LO}+w_{IF})t)+\sin((w_{LO}-w_{IF})t)] \quad \text{[Equation 10]}$$

The operation at the first mixer 500 is expressed by equation 7, and the operation at the second mixer 502 is expressed by equation 8. The operation at the third mixer 504 is expressed by equation 9, and the operation at the fourth mixer 506 is expressed by equation 10. After the mixing, the signals from the first and the second mixers 500 and 502, respectively, are transmitted to the first adder 510, and signals from the third and fourth mixers 504 and 506, respectively, are transmitted to the second adder 512. The adders 510 and 512 add the respective received signals. The following equation 11 expresses the operation at the first adder 510, and equation 12 expresses the operation at the second adder 512.

$$\frac{1}{2}[\cos((w_{LO}+w_{IF})t)+\cos((w_{LO}-w_{IF})t)]+ \quad \text{[Equation 11]}$$
$$\frac{1}{2}[-\cos((w_{LO}+w_{IF})t)+\cos((w_{LO}-w_{IF})t)] =$$
$$\cos((w_{LO}-w_{IF})t)$$

$$\frac{1}{2}[\sin((w_{LO}+w_{IF})t)+\sin((w_{LO}-w_{IF})t)]+ \quad \text{[Equation 12]}$$
$$\frac{1}{2}[-\sin((w_{LO}+w_{IF})t)+\sin((w_{LO}-w_{IF})t)] =$$
$$\sin((w_{LO}-w_{IF})t)$$

Equation 11 outputs an I-component, and equation 12 outputs a Q-component, and QPSK modulation is used.

Next, a description as to when the Q-component of the IF signal is inputted to the first and third mixers 500 and 504 and the I-component of the IF signal is inputted to the second and fourth mixers 502 and 506 is given. The Q-component to the first and third mixers 500 and 504 is sin(w_IF t), and the I-component to the second and fourth mixers 502 and 506 is cos(w_IF t).

$$\cos(w_{LO}t)\sin(w_{IF}t) = \quad \text{[Equation 13]}$$
$$\frac{1}{2}[\sin((w_{LO}+w_{IF})t) - \sin((w_{LO}-w_{IF})t)]$$

$$\sin(w_{LO}t)\cos(w_{IF}t) = \quad \text{[Equation 14]}$$
$$\frac{1}{2}[\sin((w_{LO}+w_{IF})t) + \sin((w_{LO}-w_{IF})t)]$$

$$\sin(w_{LO}t)\sin(w_{IF}t) = \quad \text{[Equation 15]}$$
$$\frac{1}{2}[-\cos((w_{LO}+w_{IF})t) + \cos((w_{LO}-w_{IF})t)]$$

$$-\cos(w_{LO}t)\cos(w_{IF}t) = \quad \text{[Equation 16]}$$
$$\frac{1}{2}[-\cos((w_{LO}+w_{IF})t) - \cos((w_{LO}-w_{IF})t)]$$

The operation at the first mixer 500 is expressed by equation 13, and the operation at the second mixer 502 is expressed by equation 14. The operation at the third mixer 504 is expressed by equation 15, and the operation at the fourth mixer 506 is expresses by equation 16. After mixing, the signals from the first and second mixers 500 and 502, respectively, are transmitted to the first adder 510, and the signals from the third and fourth mixers 504 and 506, respectively, are transmitted to the second adder 512. The adders 510 and 512 add the respective received signals. The following equation 17 expresses the operation at the first adder 510, and equation 18 expresses the operation at the second adder 512.

$$\frac{1}{2}[\sin((w_{LO}+w_{IF})t) - \sin((w_{LO}-w_{IF})t)] + \quad \text{[Equation 17]}$$
$$\frac{1}{2}[\sin((w_{LO}+w_{IF})t) + \sin((w_{LO}-w_{IF})t)] =$$
$$\sin((w_{LO}+w_{IF})t)$$

$$\frac{1}{2}[-\cos((w_{LO}+w_{IF})t) + \cos((w_{LO}-w_{IF})t)] - \quad \text{[Equation 18]}$$
$$\frac{1}{2}[\cos((w_{LO}+w_{IF})t) + \cos((w_{LO}-w_{IF})t)] =$$
$$-\cos((w_{LO}+w_{IF})t)$$

Equation 17 outputs an I-component, and equation 18 outputs a Q-component, and QPSK modulation is used.

Figure 6:
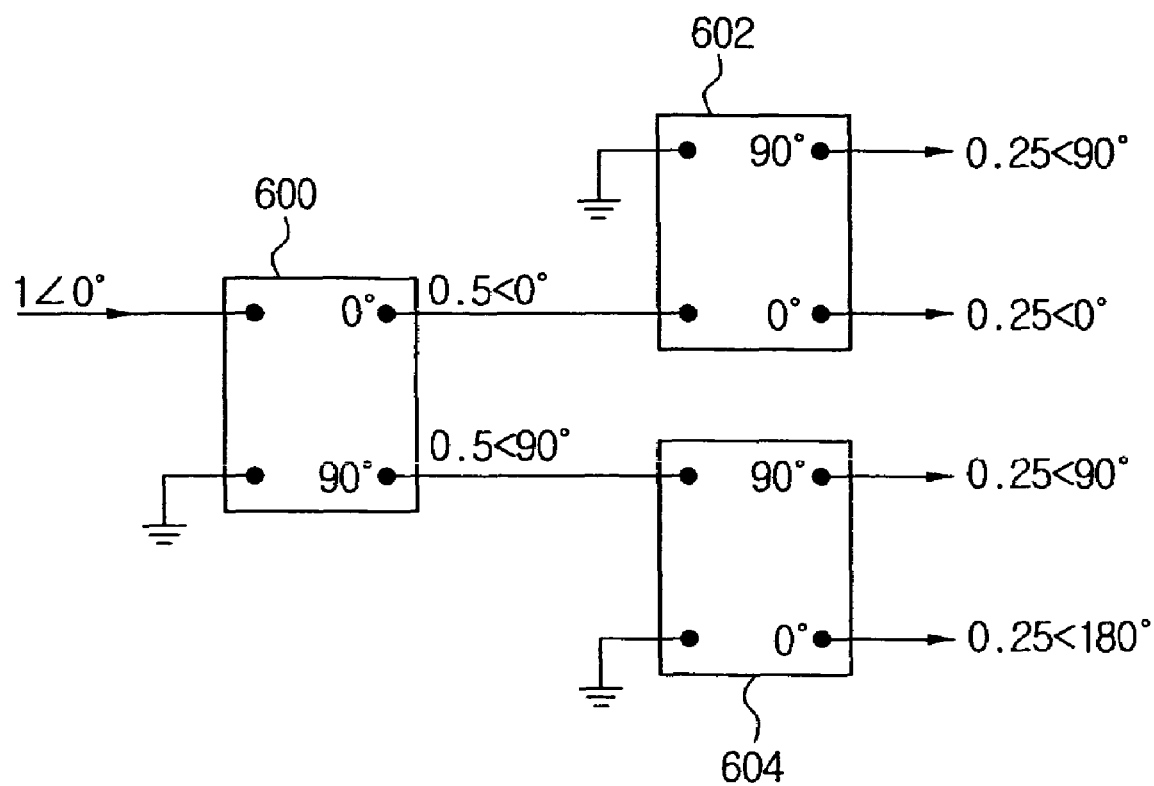
FIG. 6 is a view illustrating the process of phase shift of local oscillated signal.

FIG. 6 illustrates the phase-shift of the generated LO signal. As the signal passes through the 3 phase-shifters shown in FIG. 6, the signal for use in the SSB generator, shown in FIG. 5, can be generated. The first phase-shifter 600 outputs the received LO signal as a signal with a phase-shift and a signal without phase-shift. The phase shift at the first phase-shifter 600 is substantially 90°. The second phase-shifter 602 receives the signal without phase-shift from first phase-shifter 600 and outputs the received signal as a signal with a phase-shift and a signal without phase-shift. The third phase-shifter 604 receives the 90°-shifted signal from first phase-shifter 600 and outputs a signal with a phase-shift and a signal without a phase-shift. Accordingly, the phase shifts of the signals outputted from the third phase-shifter 604 are substantially 90° and 180°, respectively.

Figure 7:
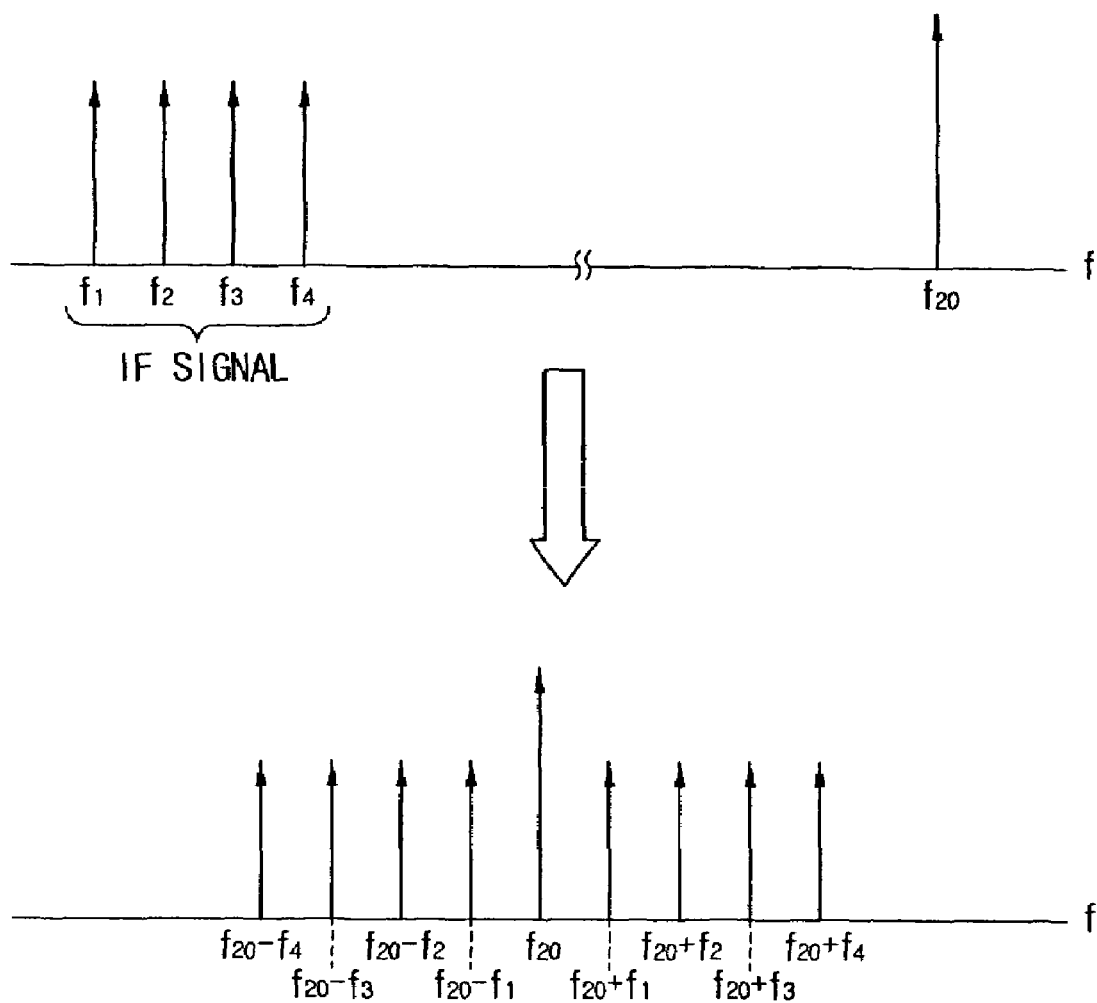
FIG. 7 is a view for comparison between the input and output signals with respect to a SSB generator.

FIG. 7 illustrates the signals that are inputted to and outputted from the SSB generator. As shown, the number of signals outputted from the SSB generator corresponds to twice the number of IF signal inputs to the SSB generator. In other words, one IF signal is inputted and two reference frequencies are outputted. As a result, a reduced number of IF signals are used for the generation of reference frequencies.

For example, assuming that the reference frequencies of 3432 MHz, 3460 MHz, 4488 MHz, 6336 MHz, 6864 MHz, 7392 MHz and 7920 MHz are generated from the SSB generator, the LO signal and the IF signal may be as follows:

TABLE 1

| LO signal | IF signal | Output signals from SSB generator |
|---|---|---|
| 5676 MHz | 660 MHz | 5016 MHz |
|  |  | 6336 MHz |
|  | 1188 MHz | 4488 Mhz |
|  |  | 6864 MHz |
|  | 1716 MHz | 3460 MHz |
|  |  | 7392 MHz |
|  | 2244 MHz | 3432 MHz |
|  |  | 7920 MHz |

By controlling the inversing part and the IF signal inputs to the inversing part as shown in table 1, the desired reference frequency can be obtained.

As described above in a few embodiments of the present invention, a reduced number of IF signals are used to generate reference frequencies for use in UWB frequency. Because a reduced number of IF signals are used, the overall power consumption of the communication system can be reduced. Additionally, by efficiently switching IF signals for the generation of reference frequencies, data transmission rate is improved.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for generating a reference signal in an ultra wideband (UWB) communication system which sends out and receives data by using at least two reference signals of a predetermined frequency, comprising:
    generating a first signal group which comprises a local oscillation (LO) signal and a signal at a predetermined phase difference with respect to the LO signal;
    selecting one among at least two intermediate frequency (IF) signals for the adjustment of the frequency of the LO signals;
    generating a second signal group which comprises the selected IF signal and a signal at a predetermined phase difference with respect to the selected IF signal;
    generating two mixed signals from the first and the second signal groups, the mixed signals being mixed without overlap; and
    generating a reference signal by adding the two generated mixed signals.

2. The method of claim 1, wherein the predetermined phase difference with respect to the LO signal comprises 90° and 180°.

3. The method of claim 2, wherein the predetermined phase difference with respect to the IF signal comprises 90°.

4. The method of claim 3, wherein the reference signal is generated by mixing the signals of the same phase from the first and the second signal groups without overlap, and the reference signal has a frequency that is lower than the frequency of the LO signal by a value corresponding to the frequency of the selected IF signal.

5. The method of claim 4, wherein a quadrature phase shift keying (QPSK) uses a first reference signal and a second reference signal, the first reference signal obtained by adding a mixed signal of a 0° phase-shifted LO signal and a 0° phase-shifted IF signal with a mixed signal of a 90° phase-shifted LO signal and a 90° phase-shifted IF signal, the second reference signal obtained by adding a mixed signal of a 180° phase-shifted LO signal and a 90° phase-shifted IF signal with a mixed signal of a 90° phase-shifted LO signal and 0° phase-shifted IF signal.

6. The method of claim 3, wherein the reference signal is generated by mixing the signals of different phases from the first and the second signal groups without overlap, and the reference signal has a frequency that is higher than the frequency of the LO signal by a value corresponding to the frequency of the selected IF signal.

7. The method of claim 6, wherein a quadrature phase shift keying (QPSK) uses a third reference signal and a fourth reference signal, the third reference signal obtained by adding a mixed signal of a 0° phase-shifted LO signal and a 90° phase-shifted IF signal, with a mixed signal of a 90° phase-shifted LO signal and a 0° phase-shifted IF signal, the fourth reference signal obtained by adding a mixed signal of a 180° phase-shifted LO signal and a 0° phase-shifted IF signal with a mixed signal of a 90° phase-shifted LO signal and 90° phase-shifted IF signal.

8. The method of claim 1, wherein the frequency of the reference signal comprises one among 3432 MHz, 3960 MHz, 4488 MHz, 6336 MHz, 6864 MHz, 7392 MHz, and 7920 MHz.

9. The method of claim 8, wherein the frequency of the LO signal is 5676 MHz.

10. The method of claim 9, wherein the frequency of the IF signal comprises one among 660 MHz, 1188 MHz, 1716 MHz and 2244 MHz.

11. An apparatus for generating a reference signal in an ultra wideband (UWB) communication system which sends out and receives data by using at least two reference signals at a predetermined frequency, the apparatus comprising:

a phase-shifter that generates a first signal group which comprises a local oscillation (LO) signal and a signal at a predetermined phase difference with respect to the LO signal;

a multiplexer that selects a signal from a second signal group which comprises at least two intermediate frequency (IF) signals and signals at a predetermined phase difference with respect to the respective IF signals, the selected signal being at a predetermined phase difference with respect to the IF signals; and a single sideband (SSB) generator for generating a reference signal by adding two mixed signals, wherein each mixed signal is generated by mixing a signal from the phase-shifter and a signal from the multiplexer, and the mixed signals are mixed without overlap.

12. The apparatus of claim 11, wherein the phase shifter generates signals at phase differences of substantially 90° and 180° with respect to the LO signal.

13. The apparatus of claim 12, wherein the predetermined phase difference with respect to the IF signal comprises 90°.

14. The apparatus of claim 13, wherein the SSB generator generates the reference signal by mixing the signals of the same phase from the first and the second signal groups without overlap, and the reference signal has a frequency that is lower than the frequency of the LO signal by a value corresponding to the frequency of the selected IF signal.

15. The apparatus of claim 14, wherein the SSB generator comprises:

a first mixer for mixing a 0° phase-shifted LO signal with a 0° phase-shifted IF signal;

a second mixer for mixing a 90° phase-shifted LO signal with a 90° phase-shifted IF signal;

a first adder for adding the signals from the first and the second mixers;

a third mixer for mixing a 180° phase-shifted LO signal with the 90° phase-shifted IF signal;

a fourth mixer for mixing the 90° phase-shifted LO signal with the 0° phase-shifted IF signal; and a second adder for adding the signals from the third and the fourth mixers.

16. The apparatus of claim 13, wherein the SSB generator generates the reference signal by mixing the signals of different phases from the phase-shifter and the multiplexer without overlap, and the reference signal has a frequency that is higher than the frequency of the LO signal by a value corresponding to the frequency of the selected IF signal.

17. The apparatus of claim 16, wherein the SSB comprises:

a first mixer for mixing a 0° phase-shifted LO signal with a 90° phase-shifted IF signal;

a second mixer for mixing a 90° phase-shifted LO signal with a 0° phase-shifted IF signal;

a first adder for adding the signals from the first and the second mixers;

a third mixer for mixing a 180° phase-shifted LO signal with the 0° phase-shifted IF signal;

a fourth mixer for mixing the 90° phase-shifted LO signal with the 90° phase-shifted IF signal; and a second adder for adding the signals from the third and the fourth mixers.

18. The apparatus of claim 11, wherein the SSB generator generates a reference signal having a frequency among 3432 MHz, 3960 MHz, 4488 MHz, 6336 MHz, 6864 MHz, 7392 MHz and 7920 MHz.

19. The apparatus of claim 18, wherein the frequency of the LO signal comprises 5676 MHz.

20. The apparatus of claim 19, wherein the frequency of the IF signal comprises one among 660 MHz, 1188 MHz, 1716 MHz and 2244 MHz.

* * * * *